(12) United States Patent
Lee et al.

(10) Patent No.: US 10,868,524 B2
(45) Date of Patent: Dec. 15, 2020

(54) SEMICONDUCTOR CIRCUIT AND SEMICONDUCTOR CIRCUIT LAYOUT SYSTEM

(71) Applicant: Samsung Electronics Co., Ltd., Gyeonggi-do (KR)

(72) Inventors: Young O Lee, Suwon-si (KR); Doo Seok Yoon, Suwon-si (KR); Min Su Kim, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/535,611

(22) Filed: Aug. 8, 2019

(65) Prior Publication Data
US 2020/0195237 A1    Jun. 18, 2020

(30) Foreign Application Priority Data

Dec. 13, 2018  (KR) .................. 10-2018-0161016
Feb. 28, 2019  (KR) .................. 10-2019-0024054

(51) Int. Cl.
*H03K 3/037*   (2006.01)
*G01R 31/3185* (2006.01)
*H03K 3/3562*  (2006.01)

(52) U.S. Cl.
CPC ... *H03K 3/0372* (2013.01); *G01R 31/318541* (2013.01); *H03K 3/35625* (2013.01)

(58) Field of Classification Search
CPC .................... H03K 3/0372; G01R 31/318541
See application file for complete search history.

(56) References Cited

U.S. PATENT DOCUMENTS

| | | | |
|---|---|---|---|
| 6,567,309 B2 | 5/2003 | Tanzawa | |
| 7,456,478 B2 | 11/2008 | Tsutsumi | |
| 7,612,599 B2 | 11/2009 | Motoyoshi et al. | |
| 8,274,319 B2 | 9/2012 | Maeno | |
| 8,717,078 B2 * | 5/2014 | Idgunji | H03K 3/0375 327/202 |
| 8,723,574 B2 | 5/2014 | Tomita | |
| 8,819,508 B2 * | 8/2014 | Devta Prasanna | G01R 31/318544 714/727 |
| 9,424,124 B2 * | 8/2016 | Georgakos | G06F 11/08 |
| 9,503,062 B2 | 11/2016 | Singh et al. | |
| 9,641,161 B1 | 5/2017 | Liu et al. | |
| 9,742,383 B2 * | 8/2017 | Maeno | G01R 31/318541 |
| 9,753,086 B2 | 9/2017 | Kim et al. | |
| 9,966,936 B2 | 5/2018 | Kim et al. | |

(Continued)

FOREIGN PATENT DOCUMENTS

JP    3692032 B2    9/2005

*Primary Examiner* — Dinh T Le
(74) *Attorney, Agent, or Firm* — Harness, Dickey and Pierce, P.L.C.

(57) ABSTRACT

A semiconductor circuit and a semiconductor circuit layout system are provided. The semiconductor circuit includes a clock inverter which inverts a clock signal and outputs an inverted clock signal where the clock inverter is laid out between a second master latch main circuit configured to latch signals of a first node and a fourth node based on the clock signal and the inverted clock signal, respectively, and a second slave latch main circuit configured to latch signals of a second node and a fifth node based on the clock signal and the inverted clock signal, respectively.

20 Claims, 16 Drawing Sheets

(56) References Cited

U.S. PATENT DOCUMENTS

| | | |
|---|---|---|
| 10,193,536 B2 * | 1/2019 | Agarwal .............. H03K 3/3562 |
| 10,587,249 B2 * | 3/2020 | Kim .................. H03K 3/35625 |
| 10,608,615 B2 * | 3/2020 | Kim .................. H03K 3/35625 |
| 2014/0289691 A1 | 9/2014 | Kasai |
| 2017/0269630 A1 | 9/2017 | Kamezawa et al. |

* cited by examiner

SEMICONDUCTOR CIRCUIT AND SEMICONDUCTOR CIRCUIT LAYOUT SYSTEM

CROSS-REFERENCE TO RELATED APPLICATION

This application claims priorities from Korean Patent Applications No. 10-2018-0161016 filed on Dec. 13, 2018 and No. 10-2019-0024054 filed on Feb. 28, 2019 in the Korean Intellectual Property Office, and all the benefits accruing therefrom under 35 U.S.C. 119, the contents of each of which in its entirety are herein incorporated by reference.

BACKGROUND

1. Technical Field

Example embodiments of the present disclosure relate to a semiconductor circuit and/or a semiconductor circuit layout system.

2. Description of the Related Art

An area of an integrated circuit (IC) such as a system-on-chip (SoC) often used in mobile devices may be reduced to increase the productivity of the mobile devices. Further, it may be desirable to reduce the power consumption of the IC.

SUMMARY

In order to reduce the power consumption of the IC, in one or more example embodiments, the power consumption of flip-flops included in the IC may be reduced by designing a layout of a semiconductor circuit (for example, a standard cell) that reduces (or, alternatively minimizes) the power consumption of a clock associated with the flip-flops.

Example embodiments of the present disclosure provide a semiconductor circuit and/or a semiconductor circuit layout system for reducing (or, alternatively, minimizing) the power consumed by the clock of the flip-flop.

According to an example embodiment of the present disclosure, there is provided a semiconductor circuit including a plurality of master latch main circuits including a first master latch main circuit and a second master latch main circuit configured to latch signals of a first node and a fourth node based on a clock signal and an inverted clock signal, respectively, and to transmit the latched signals of the first node and the fourth node to a second node and a fifth node, respectively; a plurality of master latch auxiliary circuits including a first master latch auxiliary circuit and a second master latch auxiliary circuit configured to feed-back a signal of the second node and a signal of the fifth node to the first master latch main circuit and the second master latch main circuit, respectively; a plurality of slave latch main circuits including a first slave latch main circuit and a second slave latch main circuit configured to latch signals of the second node and the fifth node based on the clock signal and the inverted clock signal, respectively, and to transmit the latched signals of the second node and the fifth node to a third node and a sixth node, respectively; a plurality of slave latch auxiliary circuits including a first slave latch auxiliary circuit and a second slave latch auxiliary circuit configured to feed-back signals of the third node and the sixth node to the first slave latch main circuit and the second slave latch main circuit, respectively; and a clock inverter configured to invert the clock signal to generate the inverted clock signal, the clock inverter being between the second master latch main circuit and the second slave latch main circuit.

According to another example embodiment of the present disclosure, there is provided a semiconductor circuit including a scan enable inverter configured to invert a scan enable signal to generate an inverted scan enable signal; a first multiplexer configured to select a first bit data or a first scan input signal based on the scan enable signal, and to output a selected one of the first bit data or the first scan input signal to a first node; a second multiplexer configured to select a selected one of a second bit data or a second scan input signal based on the scan enable signal, and to output the selected one of the second bit data or the second scan input signal to a fourth node; a plurality of master latch circuits including a first master latch circuit and a second master latch circuit configured to latch signals of the first node and the fourth node based on a clock signal and an inverted clock signal, respectively, and to transmit the latched signals of the first node and the fourth node to a second node and a fifth node, respectively; a plurality of slave latch circuits including a first slave latch circuit and a second slave latch circuit configured to latch signals of the second node and the fifth node based on the clock signal and the inverted clock signal, respectively, and to transmit the latched signals of the second node and the fifth node to a third node and a sixth node, respectively; and a clock inverter configured to invert the clock signal to generate the inverted clock signal, the clock inverter being between the second multiplexer and the second master latch circuit.

According to still another example embodiment of the present disclosure, there is provided a semiconductor circuit layout system including a storage device configured to store a standard cell design; and processing circuitry configured to lay out the standard cell design to generate a layout such that the layout includes, a plurality of master latch main circuits including a first master latch main circuit and a second master latch main circuit configured to latch signals of a first node and a fourth node based on a clock signal and an inverted clock signal, respectively, and to transmit the latched signals of the first node and the fourth node to a second node and a fifth node, respectively; a plurality of master latch auxiliary circuits including a first master latch auxiliary circuit and a second master latch auxiliary circuit configured to feed-back a signal of the second node and a signal of the fifth node to the first master latch main circuit and the second master latch main circuit, respectively; a plurality of slave latch main circuits including a first slave latch main circuit and a second slave latch main circuit configured to latch signals of the second node and the fifth node based on the clock signal and the inverted clock signal, respectively, and to transmit the latched signals of the second node and the fifth node to a third node and a sixth node, respectively; a plurality of slave latch auxiliary circuits including a first slave latch auxiliary circuit and a second slave latch auxiliary circuit configured to feed-back signals of the third node and the sixth node to the first slave latch main circuit and the second slave latch main circuit, respectively; and a clock inverter configured to invert the clock signal to generate the inverted clock signal, wherein the processing circuitry is configured to lay out the clock inverter such that the clock inverter is between the second master latch main circuit and the second slave latch main circuit.

However, example embodiments of the present disclosure are not restricted to the one set forth herein. The above and other aspects of the present disclosure will become more apparent to one of ordinary skill in the art to which the present disclosure pertains by referencing the detailed description of the present disclosure given below.

BRIEF DESCRIPTION OF THE DRAWINGS

The above and other aspects and features of the present disclosure will become more apparent by describing in detail example embodiments thereof with reference to the attached drawings, in which.

DETAILED DESCRIPTION

Hereinafter, various example embodiments of the present disclosure will be described with reference to the attached drawings.

Figure 1:
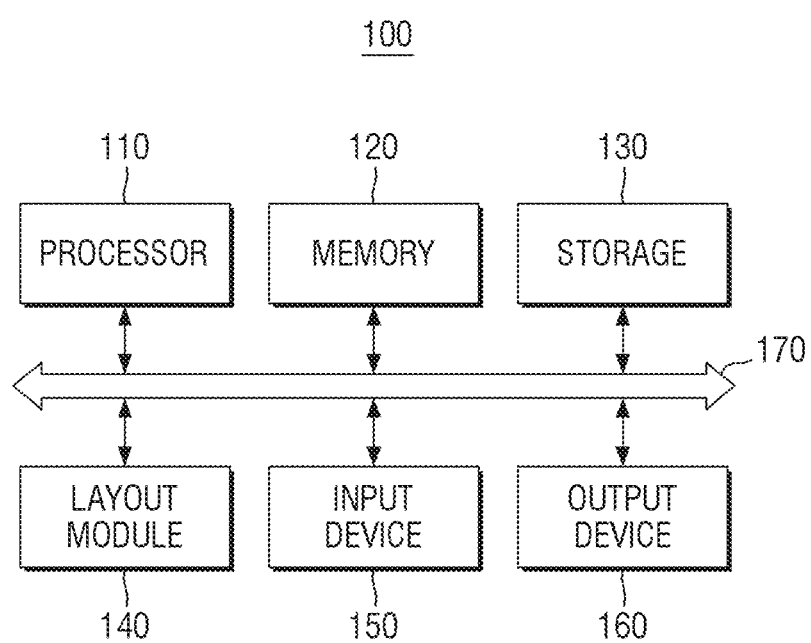
FIG. 1 is a block diagram illustrating a semiconductor circuit layout system according to an example embodiment of the present disclosure.

FIG. 1 is a block diagram for explaining a semiconductor circuit layout system according to an example embodiment of the present disclosure.

Referring to FIG. 1, a layout system 100 of the semiconductor circuit according to an example embodiment of the present disclosure may perform layout on the semiconductor circuit.

The layout system 100 may include a processor 110, a memory 120, a storage 130, a layout module 140, an input device 150 and an output device 160. Further, the processor 110, the memory 120, the storage 130, the layout module 140, the input device 150 and the output device 160 may be electrically connected via a bus 170, and may exchange the data with each other. However, the scope of the present disclosure is not limited thereto, and the layout system 100 may be implemented to omit one or more of the processor 110, the memory 120, the storage 130, the layout module 140, the input device 150 and the output device 160, or may be implemented to further include a device (for example, a display device) not illustrated in FIG. 1, depending on the specific implementation purpose.

The layout module 140 may perform the layout on the semiconductor circuit described herein. The layout module 140 may be implemented in software, hardware or a combination of software and hardware. When implemented in software, the layout module 140 may include one or more instructions for performing the layout on the semiconductor circuit described herein. On the other hand, when implemented in hardware, the layout module 140 may include, for example, one or more programmable electronic circuits for performing the layout on the semiconductor circuits described herein. On the other hand, a part of the layout module 140 may be implemented in software, and the other part thereof may be implemented in hardware.

The layout module 140 may lay out one or more standard cell designs in accordance with defined requirements, for example, design rules, using the processor 110. The standard cell designs may be stored in the storage 130. The layout on the semiconductor circuit performed by the layout module 140 will be described below in connection with FIGS. 6 to 16.

The processor 110 controls the overall operation of the layout system 100. In particular, processor 110 may control or execute the layout module 140 to perform the layout on the semiconductor circuits described herein. In some example embodiments of the present disclosure, the processor 110 may be implemented by a central processing unit (CPU), a graphic processing unit (GPU) and the like, but the scope of the present disclosure is not limited thereto.

For example, in some example embodiments, the processor 110 may be implemented using processing circuitry such as hardware including logic circuits, a hardware/software combination such as a processor executing software; or a combination thereof. For example, the processing circuitry may include, but is not limited to, a central processing unit (CPU), an arithmetic logic unit (ALU), a digital signal processor, a microcomputer, a field programmable gate array (FPGA), a System-on-Chip (SoC) a programmable logic unit, a microprocessor, or an application-specific integrated circuit (ASIC), etc.

As discussed in more detail below, the processor 110 may be configured as a special purpose processor to perform the operations of the layout module 140 such that the processor 110 performing the functions of layout module 140 lays out a clock inverter between a master latch main circuit and a slave latch main circuit in a semiconductor circuit. Therefore, the processor 110 performing the operations of layout module 140 may improve the functioning of the semiconductor circuit by reducing the amount of power consumed by the clock inverter.

The memory 120 provides a space capable of storing instructions, program code, data, and the like used by the layout module 140 to perform the layout on the semiconductor circuit described herein. In some example embodiments of the present disclosure, the memory 120 may be implemented in volatile memory such as a dynamic random access memory (DRAM) and a static random access memory (SRAM), but the scope of the present disclosure is not limited thereto, and the memory 120 may be implemented in a non-volatile memory such as a flash memory.

When all or part of the layout module 140 is implemented by software, the storage 130 may store the instructions or program code, may store the data required for the layout module 140 to execute the layout on the semiconductor circuit described herein, or may store, for example, constraints such as design rules, data on various elements used in the layout of the semiconductor circuit, and layout related data such as standard cell data. In some example embodiments of the present disclosure, the storage 130 may be implemented by a solid state drive (SSD), a hard disk drive (HDD) and the like. However, the scope of the present disclosure is not limited thereto, and the storage 130 may be implemented by any non-transitory computer readable medium.

The layout system 100 may receive layout related data from a user or other devices implemented inside/outside the layout system 100, using the input device 150, and may transmit layout related data, stored data, result data and the like to the user or other devices implemented inside/outside the layout system 100, using the output device 160.

FIGS. 2 to 5 are circuit diagrams for explaining the semiconductor circuit according to an example embodiment of the present disclosure.

Figure 2:
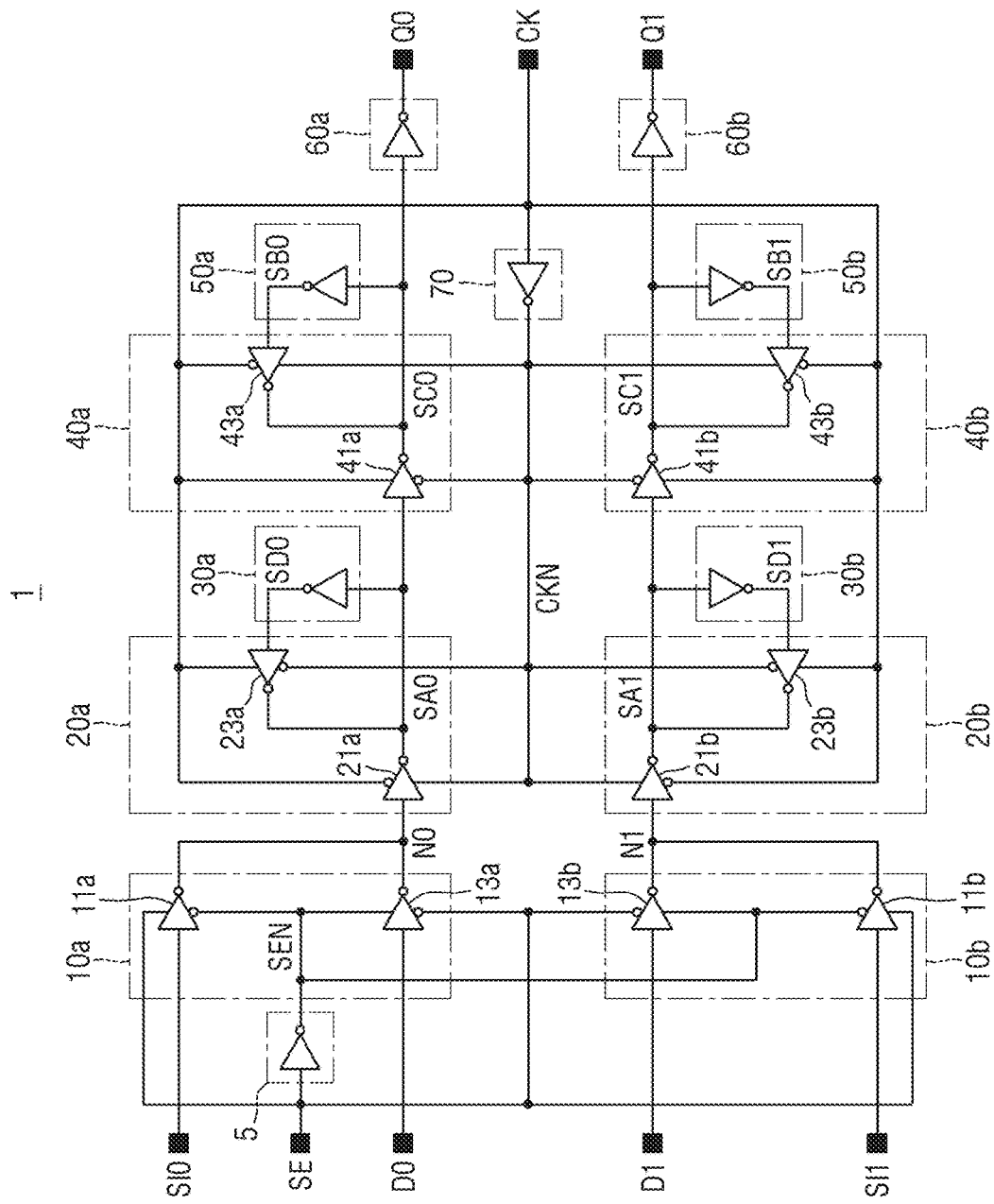
FIGS. 2 to 5 are circuit diagrams illustrating the semiconductor circuit according to an example embodiment of the present disclosure.

Referring to FIG. 2, the semiconductor circuit 1 according to an example embodiment of the present disclosure may include input selecting circuits 5, 10a and 10b, master latch main circuits 20a and 20b, master latch auxiliary circuits 30a and 30b, slave latch main circuits 40a and 40b, slave latch auxiliary circuits 50a and 50b, output drivers 60a and 60b, and a clock inverter 70.

It should be noted that, although FIG. 2 illustrates a multibit scan flip-flop including all of the input selecting circuits 5, 10a and 10b, the master latches 20a, 20b, 30a and 30b, the slave latches 40a, 40b, 50a and 50b, the output drivers 60a and 60b, and the clock inverter 70, the scope of the present disclosure is not limited thereto. In particular, the semiconductor circuit of the present disclosure may include a simple multibit flip-flop in which the input selecting circuits 5, 10a and 10b are omitted from FIG. 6 or a simple multibit latch in which the input selecting circuits 5, 10a and 10b, and the master latches 20a, 20b, 30a and 30b are omitted from FIG. 6.

The input selecting circuits 5, 10a and 10b receive data D0 and D1 or scan input signals SI0 and SI1 for a scan operation of the semiconductor circuit, and provide one of them to the nodes N0 and N1. Specifically, the input selecting circuits 5, 10a and 10b include a scan enable inverter 5 and multiplexers 10a and 10b.

The multiplexer 10a selects one of the first bit data D0 and the first scan input signal SI0 in accordance with a value of an inverted scan enable signal SEN provided from the scan enable inverter 5, and provides it to the node N0. To this end, the multiplexer 10a may include tri-state inverters 11a and 13a. Here, when the scan enable signal SE is logic high and the inverted scan enable signal SEN is logic low, the tri-state inverter 11a inverts the first scan input signal SI0 and outputs it to the node N. On the other hand, when the scan enable signal SE is logic low and the inverted scan enable signal SEN is logic high, the tri-state inverter 13a inverts the first bit data D0 and outputs it to the node N0.

Further, the multiplexer 10b selects one of the second bit data D1 and the second scan input signal SI1 in accordance with the value of the inverted scan enable signal SEN provided from the scan enable inverter 5, and provides it to the node N1. To that end, the multiplexer 10b may include tri-state inverters 11b and 13b. Here, when the scan enable signal SE is logic high and the inverted scan enable signal SEN is logic low, the tri-state inverter 11b inverts the second scan input signal SI1, and outputs it to the node N1. On the other hand, when the scan enable signal SE is logic low and the inverted scan enable signal SEN is logic high, the tri-state inverter 13b inverts the second bit data D1 and outputs it to the node N1.

On the other hand, the clock inverter 70 receives the clock signal CK, and outputs an inverted clock signal CKN obtained by inverting the clock signal CK. The clock signal CK and the inverted clock signal CKN are provided to the master latch main circuits 20a and 20b and the slave latch main circuits 40a and 40b.

The master latch main circuit 20a latches the signal of the node N0 on the basis of the clock signal CK and the inverted clock signal CKN, and transmits the signal to the node SA0. To this end, the master latch main circuit 20a may include tri-state inverters 21a and 23a. Here, when the clock signal CK is logic low and the inverted clock signal CKN is logic high, the tri-state inverter 21a inverts the signal of the node N0 and outputs the signal to the node SA0. Unlike this, when the clock signal CK is logic high and the inverted clock signal CKN is logic low, the tri-state inverter 21a may disconnect the node SA0 from the node N0.

On the other hand, the master latch auxiliary circuit 30a receives the output signal of the master latch main circuit 20a via the node SA0, and feeds back the output signal thereof to the master latch main circuit 20a. Specifically, the master latch auxiliary circuit 30a inverts the output signal of the tri-state inverter 21a applied to the node SA0 again, thereby feeding back the signal to be output to the node SD0 to the master latch main circuit 20a. Further, when the clock signal CK is logic high and the inverted clock signal CKN is logic low, that is, the node SA0 is disconnected from the node N0, the tri-state inverter 23a inverts the signal provided from the master latch auxiliary circuit 30a and outputs the signal to the node SA0. As a result, the signal latched by the tri-state inverter 21a from the node N0 is maintained at the same value in a section in which the clock signal CK is logic high.

Further, the master latch main circuit 20b latches the signal of the node N1 on the basis of the clock signal CK and the inverted clock signal CKN, and transmits the signal to the node SA1. To this end, the master latch main circuit 20b may include tri-state inverters 21b and 23b. Here, when the clock signal CK is logic low and the inverted clock signal CKN is logic high, the tri-state inverter 21b inverts the signal of the node N1 and outputs it to the node SA1. Unlike this, when clock signal CK is logic high and the inverted clock signal CKN is logic low, the tri-state inverter 21b may disconnect the node SA1 from the node N1.

On the other hand, the master latch auxiliary circuit 30b receives the output signal of the master latch main circuit 20b via the node SA1, and feeds back the output signal thereof to the master latch main circuit 20b. Specifically, the master latch auxiliary circuit 30b inverts the output signal of the tri-state inverter 21b applied to the node SA1 again, thereby feeding back the signal to be output to the node SD1 to the slave latch main circuit 20b. Further, when the clock signal CK is logic high and the inverted clock signal CKN is logic low, that is, the node SA1 is disconnected from the node N1, the tri-state inverter 23b inverts the signal provided from the master latch auxiliary circuit 30b and outputs the signal to the node SA1. As a result, the signal latched by the tri-state inverter 21b from the node N1 is maintained at the same value in a section in which the clock signal CK is logic high.

Next, the slave latch main circuit 40a latches the signal of the node SA0 on the basis of the clock signal CK and the inverted clock signal CKN, and transmits the signal to the node SC0. To this end, the slave latch main circuit 40a may include tri-state inverters 41a and 43a. Here, when the clock signal CK is logic high and the inverted clock signal CKN is logic low, the tri-state inverter 41a inverts the signal of the node SA0 and outputs the signal to the node SC0. Unlike this, when the clock signal CK is logic low and the inverted clock signal CKN is logic high, the tri-state inverter 41a may disconnect the node SC0 from the node SA0.

On the other hand, the slave latch auxiliary circuit 50a receives the output signal of the slave latch main circuit 40a via the node SC0 and feeds back the output signal thereof to the slave latch main circuit 40a. Specifically, the slave latch auxiliary circuit 50a inverts the output signal of the tri-state inverter 41a provided to the node SC0 again, thereby to feeding back the signal to be output to the node SB0 to the slave latch main circuit 40a. Further, when the clock signal CK is logic low and the inverted clock signal CKN is logic high, that is, the node SC0 is disconnected from the node SA0, the tri-state inverter 43a inverts the signal provided from the slave latch auxiliary circuit 50a and outputs the signal to the node SC0. As a result, the signal latched by the tri-state inverter 41a from the node SA0 is maintained at the same value in a section in which the clock signal CK is logic low.

Further, the slave latch main circuit 40b latches the signal of the node SA1 on the basis of the clock signal CK and the inverted clock signal CKN, and transmits the signal to the node SC1. To this end, the slave latch main circuit 40b may include tri-state inverters 41b and 43b. Here, when the clock signal CK is logic high and the inverted clock signal CKN is logic low, the tri-state inverter 41b inverts the signal of the node SA1 and outputs the signal to the node SC1. Unlike this, when the clock signal CK is logic low and the inverted clock signal CKN is logic high, the tri-state inverter 41b may disconnect the node SC1 from the node SA1.

On the other hand, the slave latch auxiliary circuit 50b receives the output signal of the slave latch main circuit 40b via the node SC1, and feeds back the output signal thereof to the slave latch main circuit 40b. Specifically, the slave latch auxiliary circuit 50b inverts the output signal of the tri-state inverter 41b provided to the node SC1 again, thereby feeding back the signal to be output to the node SB1 to the slave latch main circuit 40b. Further, when the clock signal CK is logic low and the inverted clock signal CKN is logic high, that is, the node SC1 is disconnected from the node SA1, the tri-state inverter 43b inverts the signal provided from the slave latch auxiliary circuit 50b and outputs the signal to the node SC1. As a result, the signal latched by the tri-state inverter 41b from the node SA1 is maintained at the same value in a section in which the clock signal CK is logic low.

The output driver 60a receives the output signal of the slave latch main circuit 40a via the node SC0, and outputs the output signal as data Q0 to the outside. Further, the output driver 60b receives the output signal of the slave latch main circuit 40b via the node SC1, and outputs the output signal as data Q1 to the outside.

Figure 3:
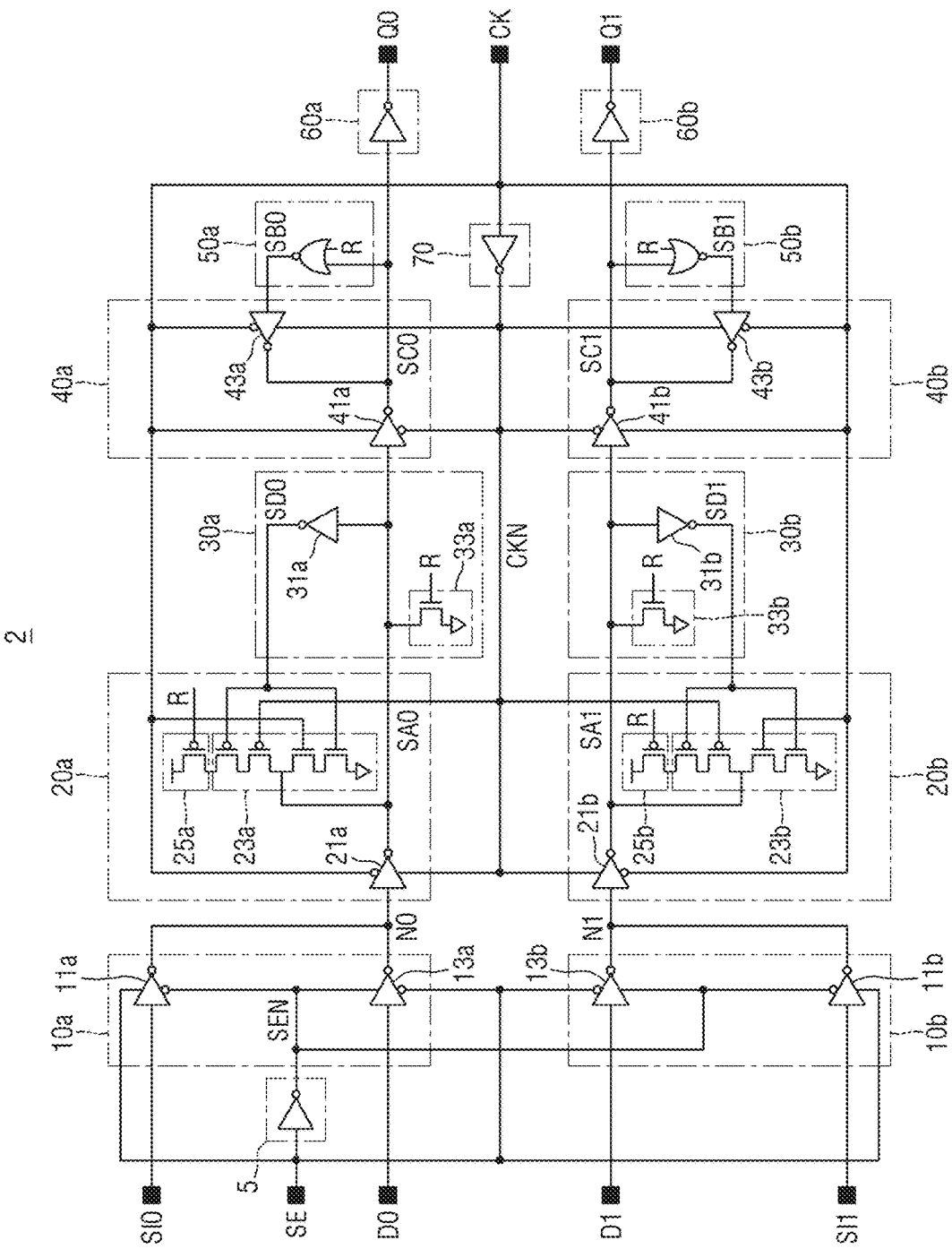

Subsequently, referring to FIG. 3, the semiconductor circuit 2 according to an example embodiment of the present disclosure may have a reset function.

To this end, the master latch main circuits 20a and 20b may include transistors 25a and 25b which are gated to the reset signal R to provide a power supply voltage VDD to the tri-state inverters 23a and 23b, respectively. Further, the master latch auxiliary circuits 30a and 30b may include transistors 33a and 33b which are gated to the reset signal R to provide a ground voltage VSS to the nodes SA0 and SA1, respectively. The slave latch auxiliary circuits 50a and 50b may include logic gates which receive the reset signal R and the signals of the nodes SC0 and SC1 as input, respectively.

Figure 4:
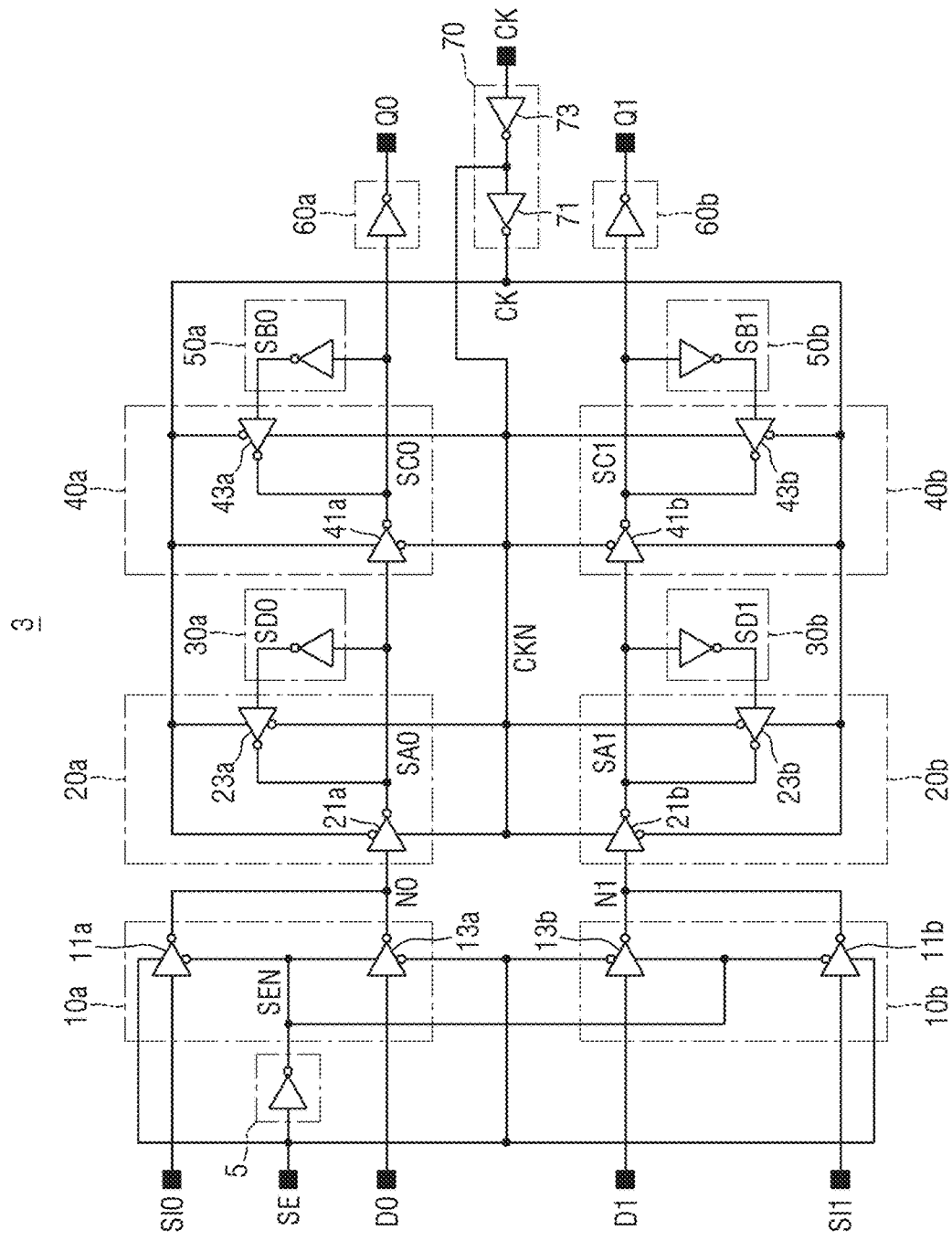

Next, referring to FIG. 4, a clock inverter 70 of the semiconductor circuit 3 according to an example embodiment of the present disclosure may include clock inverters 71a and 73a connected in series to each other.

Figure 5:
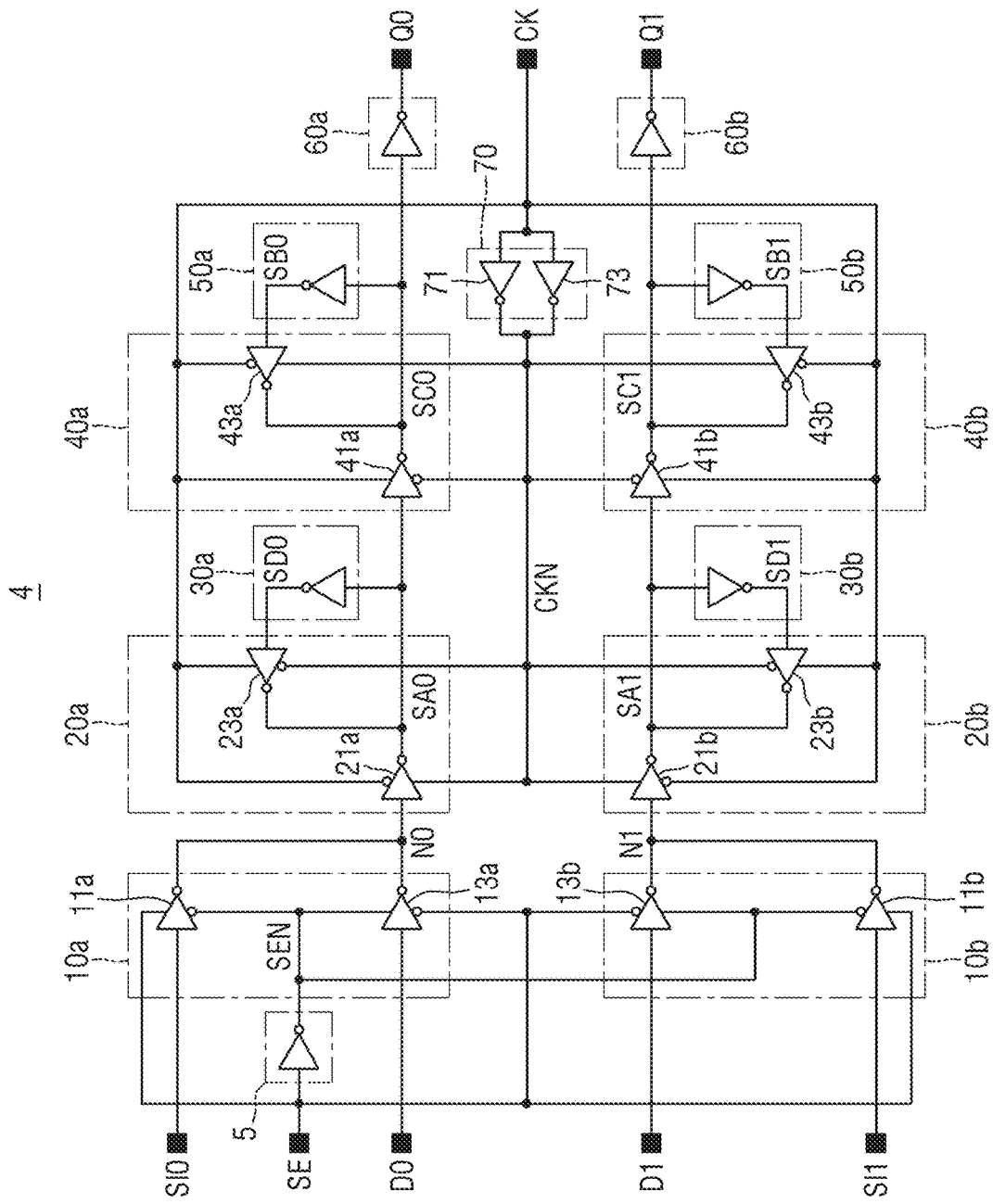

Next, referring to FIG. 5, the clock inverter 70 of the semiconductor circuit 4 according to an embodiment of the present disclosure may include clock inverters 71a and 73a connected in parallel with each other.

In the semiconductor circuits 1, 2, 3 and 4, the master latch main circuits 20a and 20b and the slave latch main circuits 40a and 40b have the clock signal CK and the inverted clock signal CKN as inputs. Further, the input selection circuits 5, 10a and 10b, the master latch auxiliary circuits 30a and 30b, the slave latch auxiliary circuits 50a and 50b and the output drivers 60a and 60b may not receive the clock signal CK and the inverted clock signal CKN as inputs.

As discussed below, example embodiments disclose reducing the amount of power consumed by the clock by setting, in the layout of the semiconductor circuit 1, 2, 3, 4, the position of the clock inverter 70, which provides the clock signal CK or the inverted clock signal CKN, relative to the master latch main circuits 20a and 20b and the slave latch main circuits 40a and 40b.

FIGS. 6 to 9 are layout diagrams illustrating the semiconductor circuits according to various example embodiments of the present disclosure.

Figure 6:
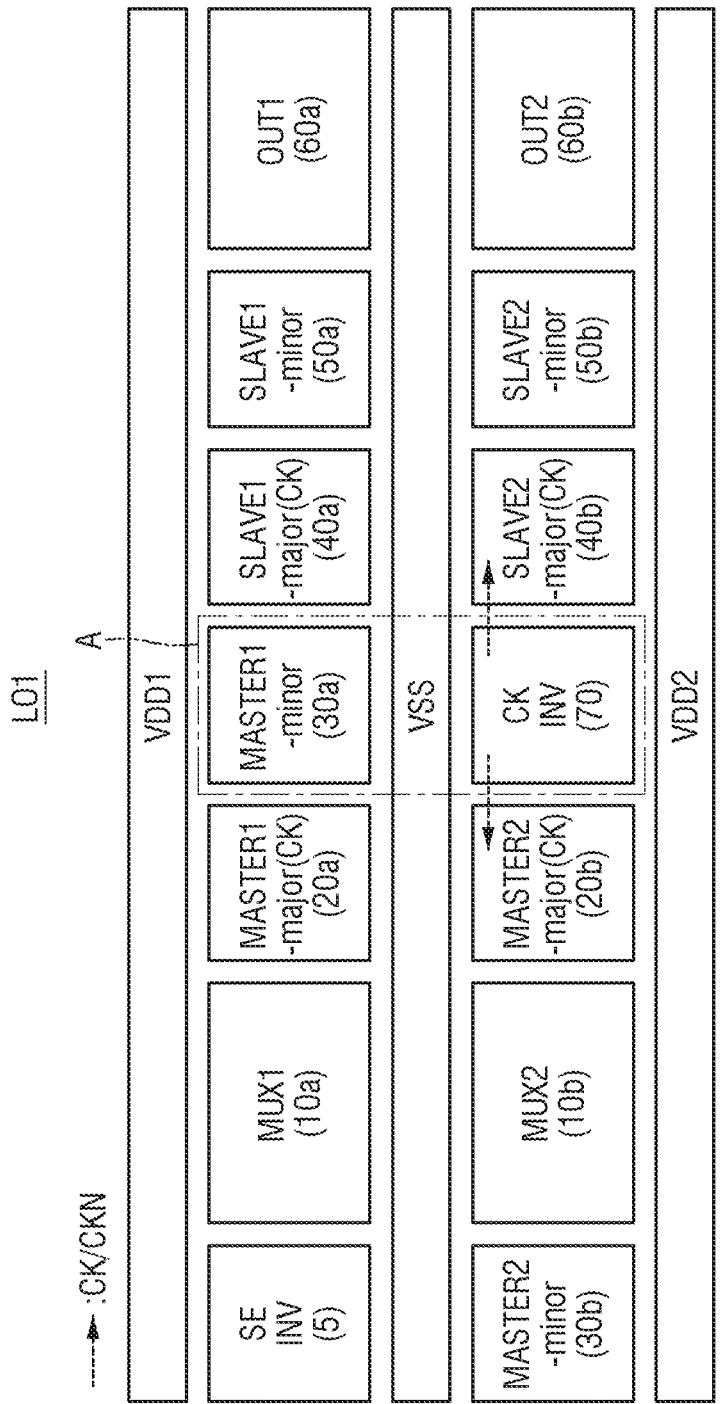
FIGS. 6 to 9 are layout diagrams illustrating the semiconductor circuit according to various example embodiments of the present disclosure.

Referring to FIG. 6, a layout L01 according to an embodiment of the present disclosure includes a scan enable inverter 5, multiplexers 10a and 10b, master latch main circuits 20a and 20b, master latch auxiliary circuits 30a and 30b, slave latch main circuits 40a and 40b, slave latch auxiliary circuits 50a and 50b, output drivers 60a and 60b, and a clock inverter 70.

Specifically, the scan enable inverter 5, the multiplexer 10a, the master latch main circuit 20a, the master latch auxiliary circuit 30a, the slave latch main circuit 40a, the slave latch auxiliary circuit 50a and the output driver 60a are arranged in a same row (e.g., a first row) in the layout L01. Further, the master latch auxiliary circuit 30b, the multiplexer 10b, the master latch main circuit 20b, the clock inverter 70, the slave latch main circuit 40b, the slave latch auxiliary circuit 50b and the output driver 60b are arranged in a same row (e.g., a second row). Further, the layout L01 may include power rails VDD1, VSS and VDD2.

That is, in the present example embodiment, the clock inverter 70 may be laid out to be arranged in a row different from the scan enable inverter 5.

Also, in the present example embodiment, the clock inverter 70 may be laid out to be arranged in a column different from the scan enable inverter 5.

Also, the clock inverter 70 may be laid out to be arranged between the master latch main circuit 20b and the slave latch main circuit 40b. In this case, the master latch auxiliary circuit 30b may be laid out to be arranged in the first column of the second row, that is, the master latch main circuit 20b may be laid out to be arranged between the master latch auxiliary circuit 30b and the clock inverter 30b.

In this case, the master latch main circuit 20a may be laid out to be arranged between the scan enable inverter 5 and the first master latch auxiliary circuit 30a. On the other hand, the master latch auxiliary circuit 30b may be laid out to be arranged in the same column as the scan enable inverter 5.

On the other hand, the multiplexer 10b may be laid out to be arranged between the master latch auxiliary circuit 30b and the second master latch main circuit 20b, and the multiplexer 10a may be laid out to be arranged between the scan enable inverter 5 and the master latch main circuit 20a.

In this way, by laying out a short length of a path between the clock inverter 70 for providing the clock signal CK or the inverted clock signal CKN, the master latch main circuits 20a and 20b and the slave latch main circuits 40a and 40b for receiving the input of the clock signal CK and the inverted clock signal CKN, the power consumed by the clock may be reduced.

On the other hand, unlike the case illustrated in FIG. 6, the clock inverter 70 may be laid out to be arranged at another position of the region A. That is, the clock inverter 70 may be laid out to be arranged between the master latch main circuit 20a and the slave latch main circuit 40a in the first row. In this case, the master latch auxiliary circuit 30a may be laid out to be arranged in the first column of the first row, and the scan enable inverter 5 may be laid out to be arranged in the first column of the second row.

Figure 7:
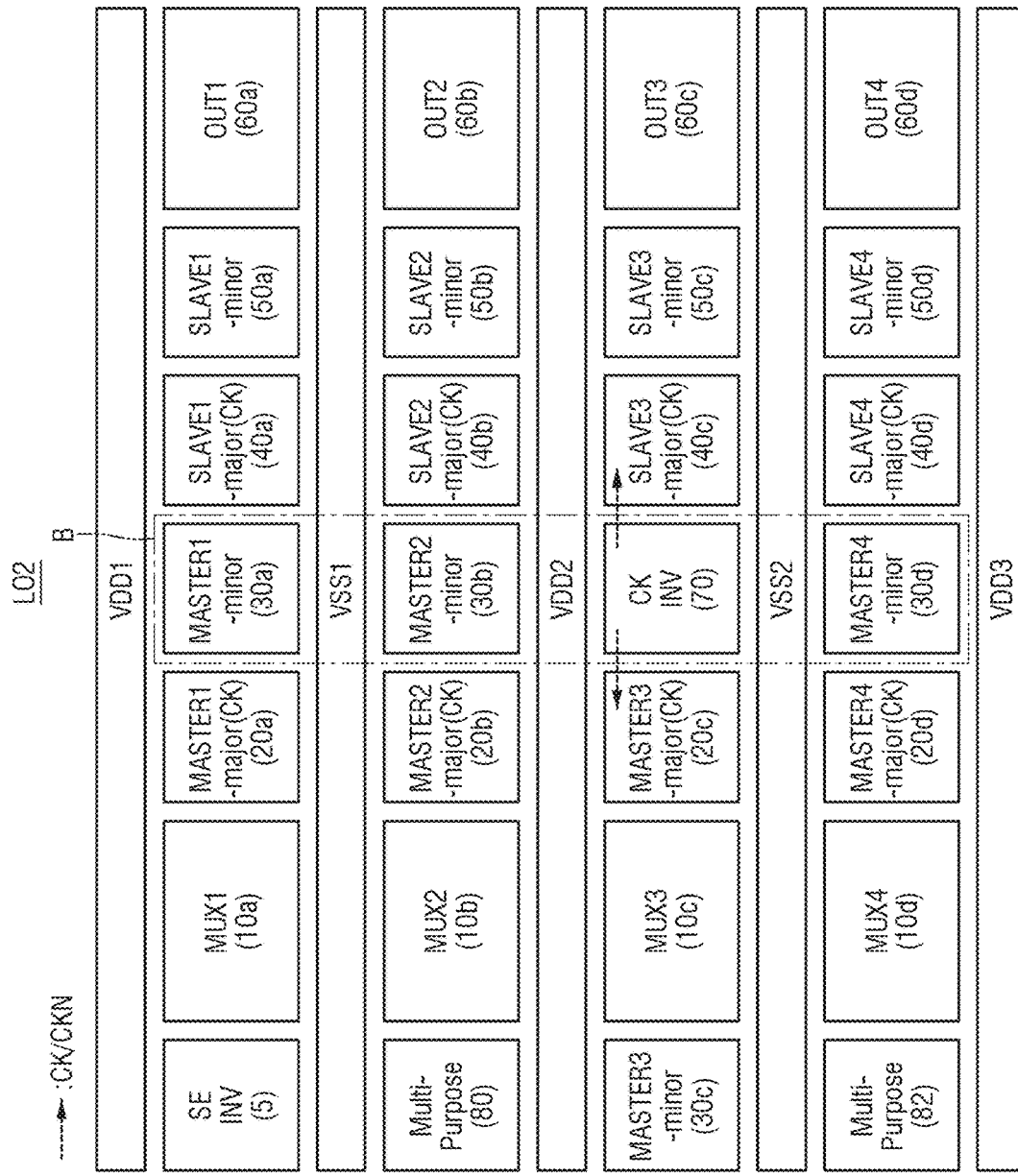

Referring to FIG. 7, a layout L02 according to an example embodiment of the present disclosure includes a scan enable inverter 5, multiplexers 10a to 10d, master latch main circuits 20a to 20d, master latch auxiliary circuits 30a to 30d, slave latch main circuits 40a to 40d, slave latch auxiliary circuits 50a to 50d, output drivers 60a to 60d and a clock inverter 70.

Specifically, the scan enable inverter 5, the multiplexer 10a, the master latch main circuit 20a, the master latch auxiliary circuit 30a, the slave latch main circuit 40a, the slave latch auxiliary circuit 50a and the output driver 60a are arranged in a same row, for example, a first row except for rows related to the power rails VDD1 to VDD3, VSS1 and VSS2 in the layout L02. Further, a multi-purpose circuit 80, the multiplexer 10b, the master latch main circuit 20b, the master latch auxiliary circuit 30b, the slave latch main circuit 40b, the slave latch auxiliary circuit 50b and the output driver 60b are arranged in the second row. Further, a master latch auxiliary circuit 30c, a multiplexer 10c, a master latch main circuit 20c, a clock inverter 70, a slave latch main circuit 40c, a slave latch auxiliary circuit 50c and an output driver 60c are arranged in the third row. Further, a multi-purpose circuit 82, a multiplexer 10d, a master latch main circuit 20d, a master latch auxiliary circuit 30d, a slave latch main circuit 40d, a slave latch auxiliary circuit 50d and an output driver 60d are arranged in the fourth row.

In this way, by laying out the short length of the path between the clock inverter 70 for providing the clock signal CK or the inverted clock signal CKN, and the master latch main circuits 20a to 20d and the slave latch main circuits 40a to 40d for receiving the input of the clock signal CK and the inverted clock signal CKN, it is possible to reduce the power consumed by the clock.

On the other hand, unlike the case illustrated in FIG. 7, the clock inverter 70 may be laid out to be arranged at another position of a region B. That is, the clock inverter 70 may be laid out to be arranged at any one position between the master latch main circuits 20a, 20b and 20d and the slave latch main circuits 40a, 40b and 40d of the first row, the second row or the fourth row.

Figure 8:
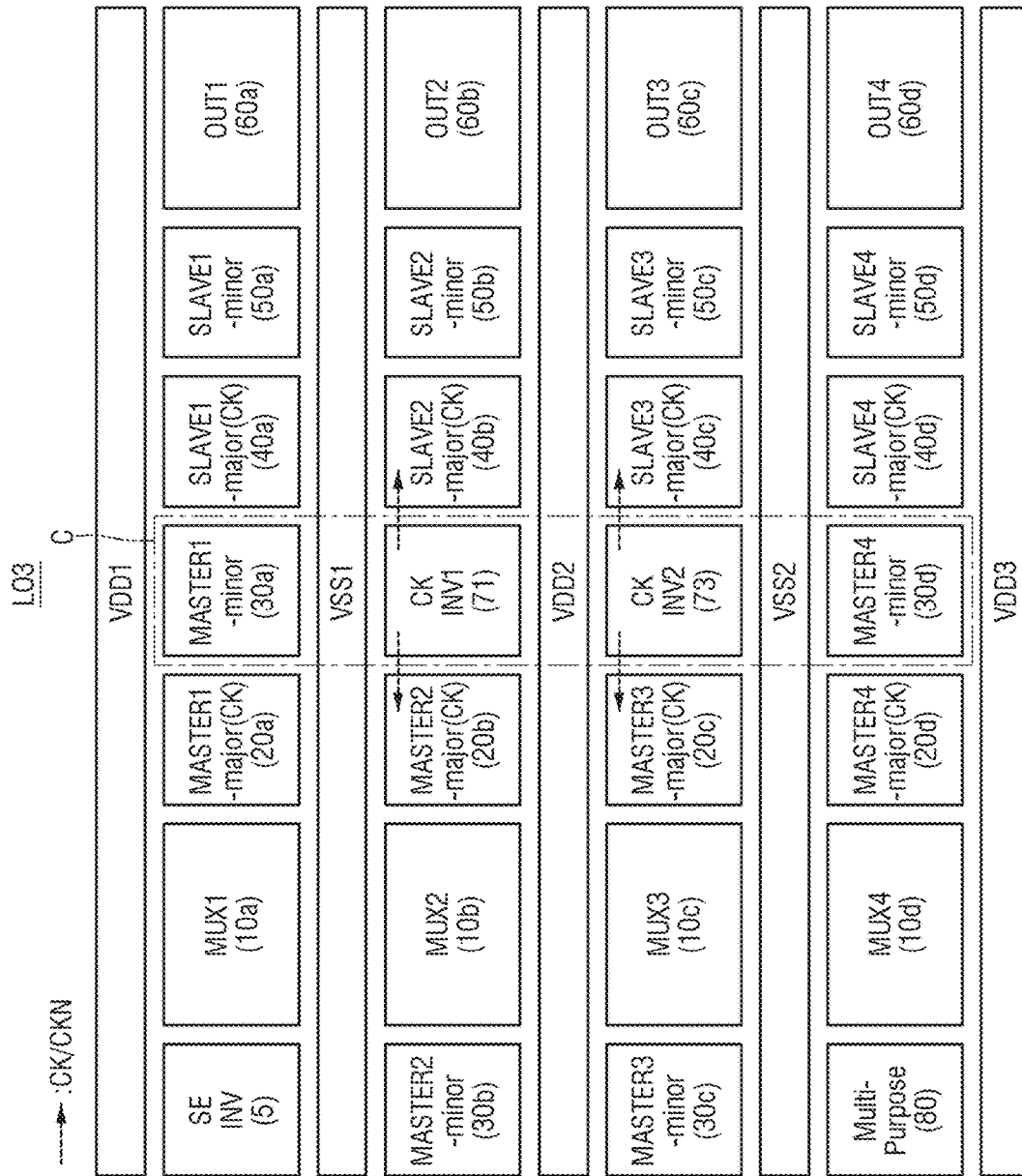

Referring to FIG. 8, a layout L03 according to an example embodiment of the present disclosure may be arranged such that clock inverters 71 and 73 are located in two rows, unlike the layout L02 of FIG. 7. That is, the clock inverter 71 may be laid out to be arranged between the master latch main circuit 20b and the slave latch main circuit 40b, and the clock inverter 73 may be laid out to be arranged between the master latch main circuit 20c and the slave latch main circuit 40c.

In this case, the master latch main circuit 20b may be arranged between the master latch auxiliary circuit 30b and the clock inverter 71, and the master latch auxiliary circuit 20b may be arranged to be located in the first column of the second row.

Further, the master latch main circuit 20c may be arranged between the master latch auxiliary circuit 30c and the clock inverter 73, and the master latch auxiliary circuit 20c may be arranged to be located in the first column of the third row.

In this way, by laying out the short length of the path between the clock inverters 71 and 73 for providing the clock signal CK or the inverted clock signal CKN, and the master latch main circuits 20d to 20d and the slave latch main circuit 40a to 40d for receiving the input of the clock signal CK and the inverted clock signal CKN, it is possible to reduce the power consumed by the clock.

On the other hand, the clock inverters 71 and 73 may be laid out to be arranged at another position of a region C, unlike the case illustrated in FIG. 8.

Figure 9:
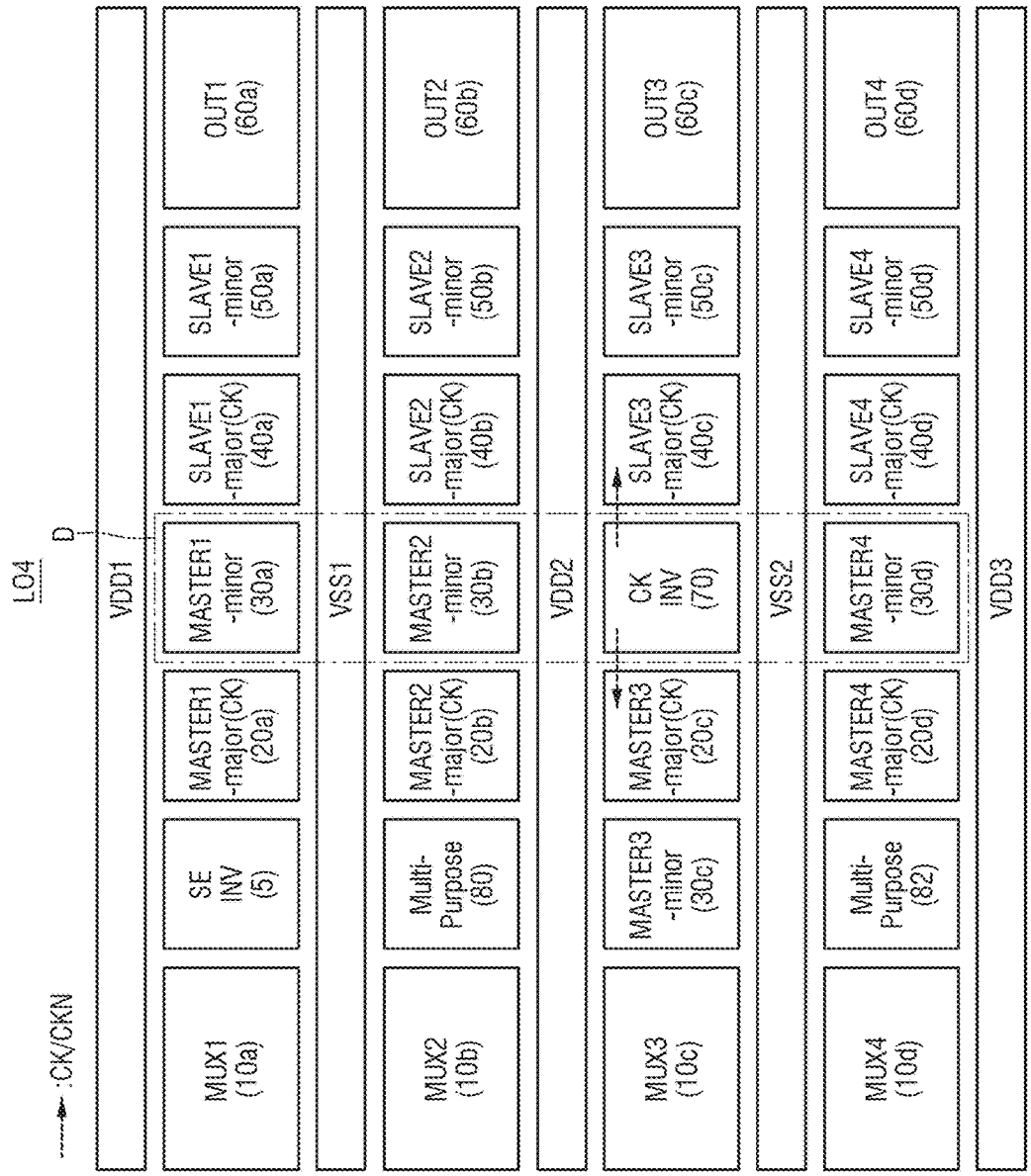

Referring to FIG. 9, a layout L04 according to an example embodiment of the present disclosure may dispose the multiplexers 10a to 10d to be located in the first column of each row, unlike the layout L02 of FIG. 7.

Further, the master latch auxiliary circuit 30c is arranged to be directly adjacent to one side of the master latch main circuit 20c, and the clock inverter 70 may be laid out to be arranged to be directly adjacent to the other side of the master latch main circuit 20c.

In this case, for example, in order to implement a non-scan flip flop which does not provide a scan function, it is possible to omit the multiplexers 10a to 10d corresponding to the first column of each row, and the scan enable inverters 5 corresponding to the second column of the first row.

In this way, by laying out the short length of the path between the clock inverter 70 for providing the clock signal CK or the inverted clock signal CKN, and the master latch main circuits 20a to 20d and the slave latch main circuits 40a to 40d for receiving the input of the clock signal CK and the inverted clock signal CKN, it is possible to reduce the power consumed by the clock.

On the other hand, unlike the case illustrated in FIG. 9, the clock inverter 70 may be laid out to be arranged at another position of a region D. That is, the clock inverter 70 may be laid out to be located at any position between the master latch main circuits 20a, 20b and 20c and the slave latch main circuits 40a, 40b and 40c of the first row, the second row or the fourth row.

Figure 10:
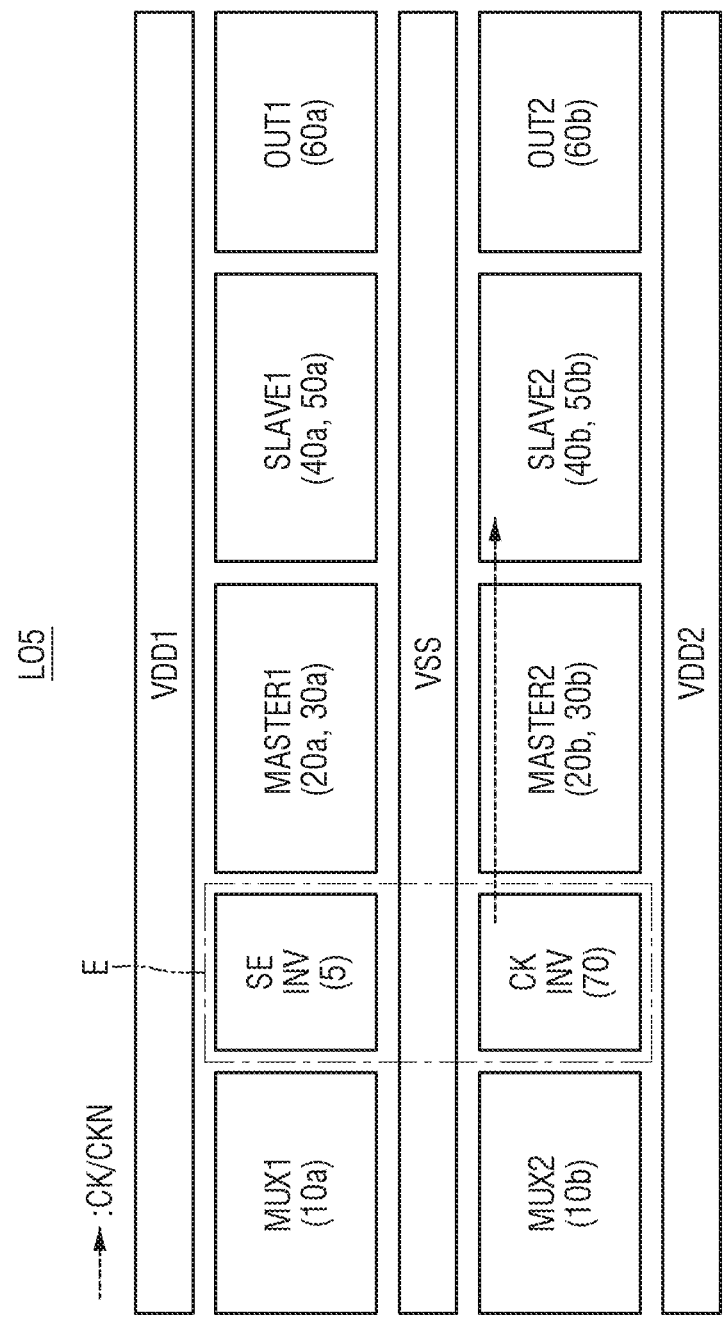
FIGS. 10 to 12 are layout diagrams illustrating the semiconductor circuit according to various example embodiments of the present disclosure.
Figure 11:
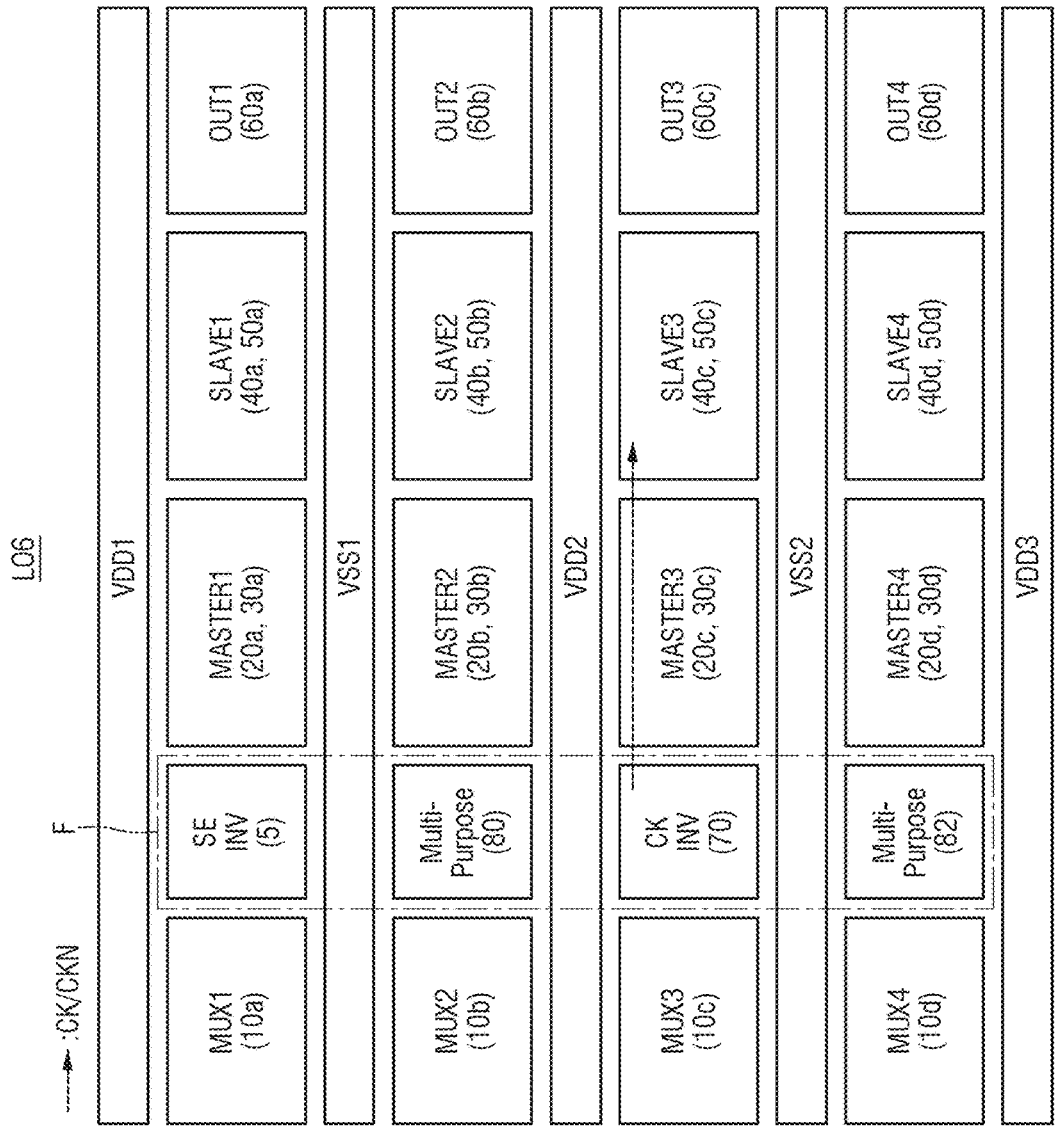
Figure 12:
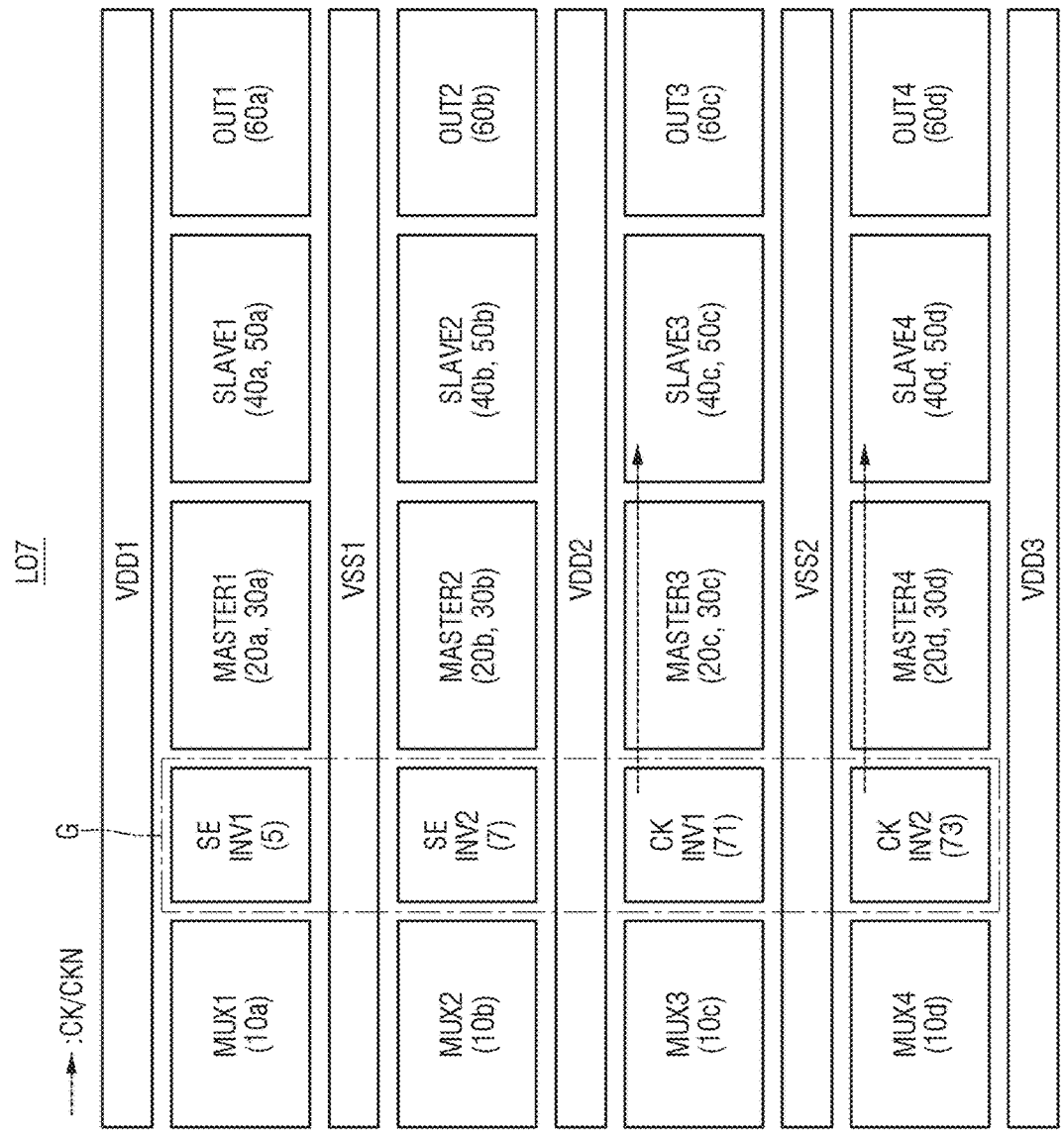

FIGS. 10 to 12 are layout diagrams illustrating semiconductor circuits according to various example embodiments of the present disclosure.

Referring to FIG. 10, a layout L05 according to an example embodiment of the present disclosure includes a scan enable inverter 5, multiplexers 10a and 10b, master latch circuits 20a, 30a, 20b and 30b, slave latch circuits 40a, 50a, 40b and 50b, output drivers 60a and 60b, and a clock inverter 70.

Specifically, the multiplexer 10a, the scan enable inverter 5, the master latch circuits 20a and 30a, the slave latch circuits 40a and 50a and the output driver 60a are arranged in a same row, for example, a first row except the power rails VDD1, VSS and VDD2 in the layout L01. Further, the multiplexer 10b, the scan inverter 70, the master latch circuits 20b and 30b, the slave latch circuits 40b and 50b and the output driver 60b are arranged in the second row.

That is, in the present example embodiment, the clock inverter 70 may be laid out to be arranged in the row different from the scan enable inverter 5.

Further, in the present embodiment, the clock inverter 70 may be laid out to be arranged in the same column as the scan enable inverter 5.

Also, the clock inverter 70 may be laid out to be arranged between the multiplexer 10b and the master latch circuits 20b and 30b.

In this case, the scan enable inverter 5 may be laid out to be arranged between the multiplexer 10a and the master latch circuits 20a and 30a.

In this way, by laying out the short length of the path between the clock inverter 70 for providing the clock signal CK or the inverted clock signal CKN, and the master latch main circuits 20a and 20b and the slave latch main circuits 40a and 40b for receiving the input of the clock signal CK and the inverted clock signal CKN, the power consumed by the clock may be reduced.

On the other hand, unlike the case illustrated in FIG. 10, the clock inverter 70 may be laid out to be arranged at another position of a region E. That is, the clock inverter 70 may be laid out to be arranged between the multiplexer 10a and the master latch circuits 20a and 20b of the first row.

Referring to FIG. 11, a layout L06 according to an example embodiment of the present disclosure includes a scan enable inverter 5, multiplexers 10a to 10d, master latch circuits 20a to 20d and 30a to 30d, slave latch circuits 40a to 40d, 50a to 50d, output drivers 60a to 60d and a clock inverter 70.

Specifically, the multiplexer 10a, the scan enable inverter 5, the master latch circuits 20a and 30a, the slave latch circuits 40a and 50a and the output driver 60a are arranged in a same row, for example, a first row except the power rails VDD1 to VDD3, VSS1, and VSS2 in the layout L02. Further, the multiplexer 10b, the multi-purpose circuit 80, the master latch circuits 20b and 30b, the slave latch circuits 40b and 50b and the output driver 60b are arranged in the second row. Further, the multiplexer 10c, the clock inverter 70, the master latch circuits 20c and 30c, the slave latch circuits 40c and 50c and the output driver 60c are arranged in the third row. Further, the multiplexer 10d, the multi-purpose circuit 82, the master latch circuits 20d and 30d, the slave latch circuits 40d and 50d and the output driver 60d are arranged in the fourth row.

In this way, by laying out the short length of the path between the clock inverter 70 for providing the clock signal CK or the inverted clock signal CKN, and the master latch main circuits 20a to 20d and the slave latch main circuits 40a to 40d for receiving the input of the clock signal CK and the inverted clock signal CKN, it is possible to reduce the power consumed by the clock.

On the other hand, unlike the case illustrated in FIG. 11, the clock inverter 70 may be laid out to be arranged at another position of the region F. That is, the clock inverter 70 may be laid out to be arranged at any position between the multiplexers 10a, 10b and 10d and the master latch circuits 20a, 20b and 20d of the first row, the second row, or the fourth row.

Referring to FIG. 12, a layout L07 according to an example embodiment of the present disclosure is different from the layout L06 of FIG. 11 in that clock inverters 71 and 73 may be arranged in two rows. That is, the clock inverter 71 may be laid out to be arranged between the multiplexer 10c and the master latch circuits 20c and 30c, and the clock inverter 73 may be laid out to be arranged between the multiplexer 10d and the master latch circuits 20d and 30d.

In this way, by laying out the short length of the path between the clock inverters 71 and 73 for providing the clock signal CK or the inverted clock signal CKN, and the master latch main circuits 20d to 20d and the slave latch main circuits 40a to 40d for receiving the input of the clock signal CK and the inverted clock signal CKN, it is possible to reduce the power consumed by the clock.

On the other hand, the clock inverters 71 and 73 may be laid out to be arranged at another position of a region G, unlike the case illustrated in FIG. 8.

Also, as in the clock inverters 71 and 73, two scan enable inverters 5 and 7 may be arranged in two rows.

FIGS. 13 to 16 are layout diagrams for explaining a semiconductor circuit according to various example embodiments of the present disclosure.

Figure 13:
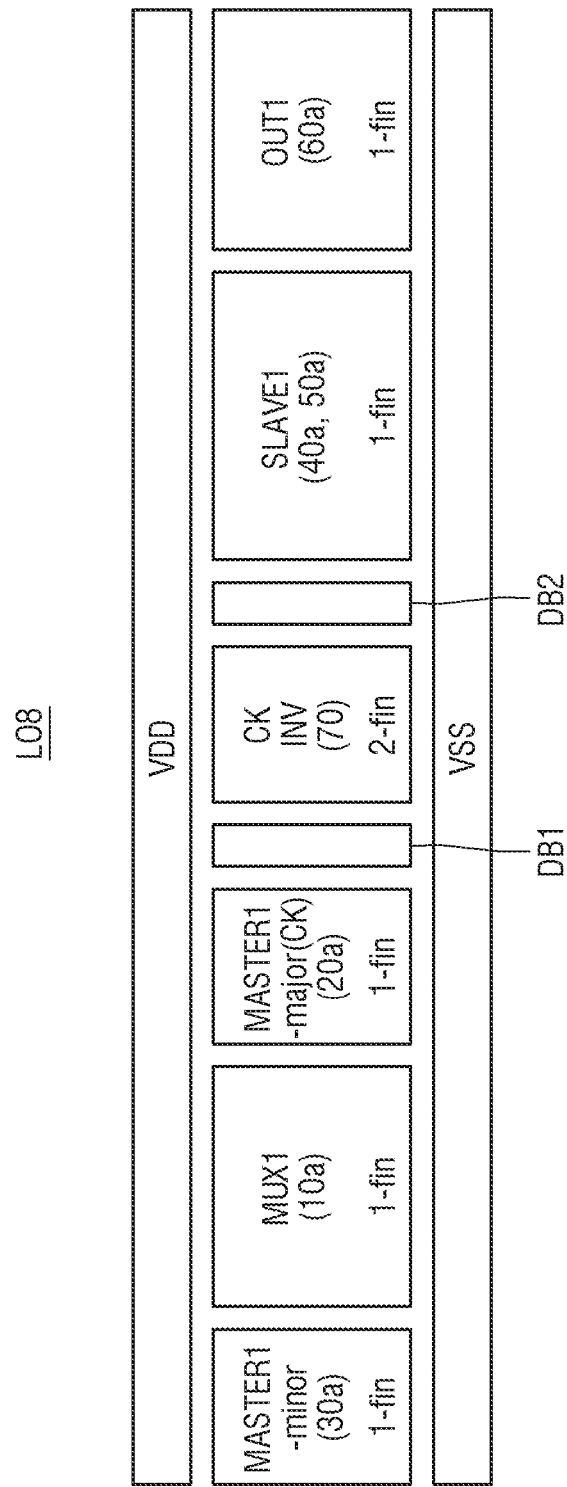
FIGS. 13 to 16 are layout diagram illustrating the semiconductor circuit according to various example embodiments of the present disclosure.

Referring to FIG. 13, a master latch auxiliary circuit 30a, a multiplexer 10a, a master latch main circuit 20a, a clock inverter 70, slave latch circuits 40a and 50a and an output driver 70 are arranged in a layout L08 in a row with diffusion breaks DB1 and DB2 surrounding the clock inverter 70 since when the semiconductor circuit is implemented using finfet transistors, the clock inverter 70 may use two fins while the other devices use only one fin. As such, the diffusion breaks DB1 and DB2 electrically isolate the clock inverter 70.

Figure 14:
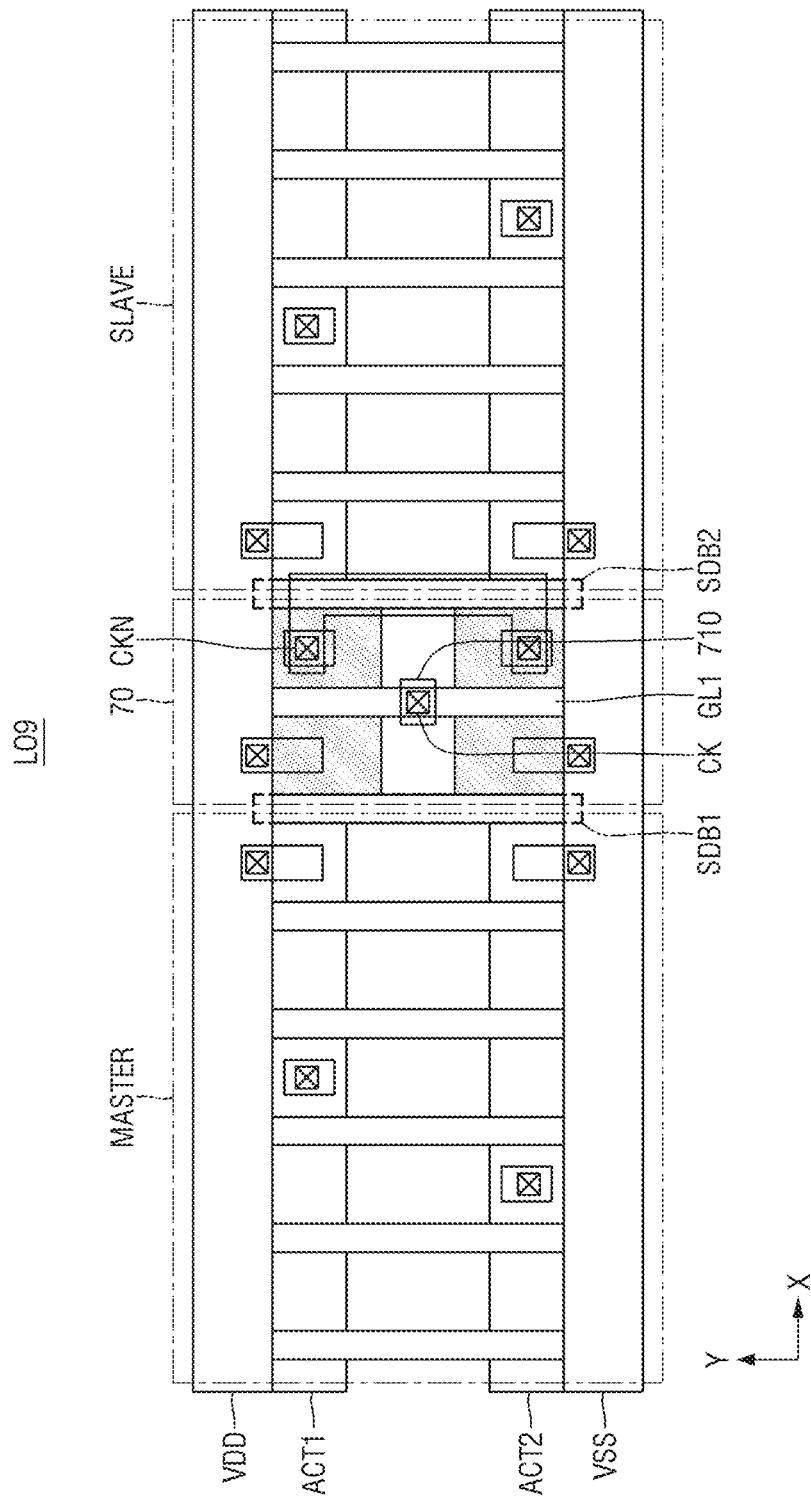

FIG. 14 is a layout L09 illustrating the output driver 70 of FIG. 13 in more detail. In the layout L09, the output driver 70 includes SDB1 (single diffusion break) and SDB2 between the surrounding master latch main circuit 20a and slave latch circuits 40a and 50a.

The reason why SDB1 and SDB2 are included is that, when the semiconductor circuit is implemented using finfet transistors, the master latch main circuit 20a and the slave latch circuits 40a and 50a use only one fin, but the output driver 70 uses two fins, and thus, there is a need for isolation between the transistors. That is, the output driver 70 of FIGS. 13 and 14 is electrically disconnected from the surrounding master latch main circuit 20a and the slave latch circuits 40a and 50a, and is implemented on another active region having a large vertical width.

The output driver 70 is generally designed to have a higher driving capability than the master latch main circuit 20a and the slave latch circuits 40a and 50a, and the current drive capability of the transistor may be adjusted by the number of active fins in the finfet process. However, when using the fins more than the surrounding master latch main circuit 20a and the slave latch circuits 40a and 50a to increase the drive capability of the output driver 70, the production yield may be reduced due to an increase in area caused by the SDB insertion.

In order to solve such a problem, it is possible to consider a way of using only one fin in implementing the output driver 70 while increasing the number of parallel connections of clock inverters.

Figure 15:
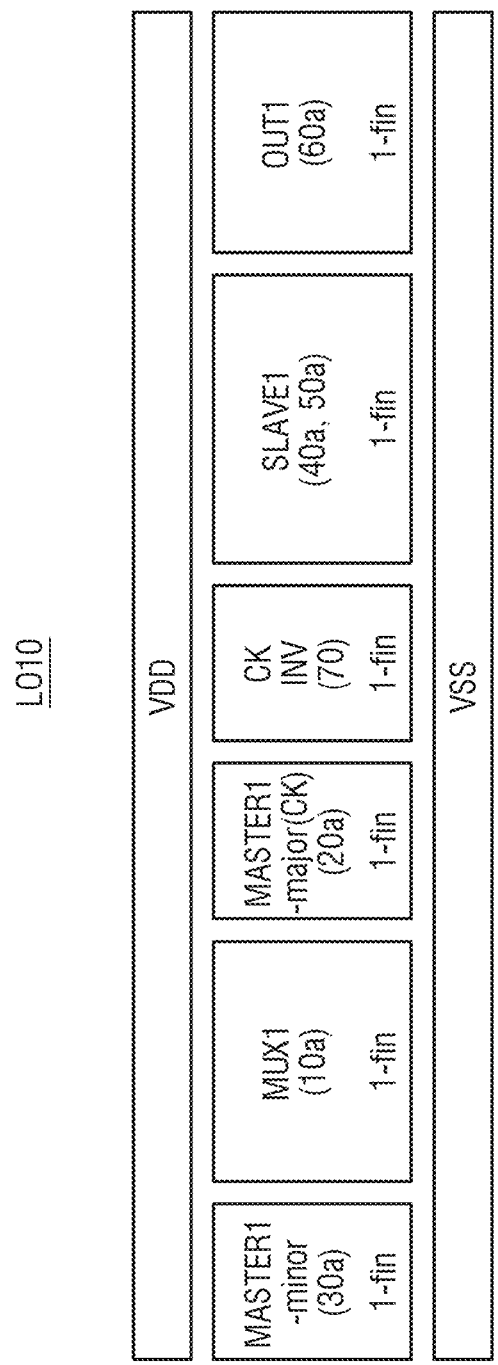

That is, referring to FIG. 15, in a layout L10 according to an example embodiment of the present disclosure, a master latch auxiliary circuit 30a, a multiplexer 10a, a master latch main circuit 20a, a clock inverter 70, slave latch circuits 40a and 50a and an output driver 70 are arranged in a row, and all of them use only one fin.

Figure 16:
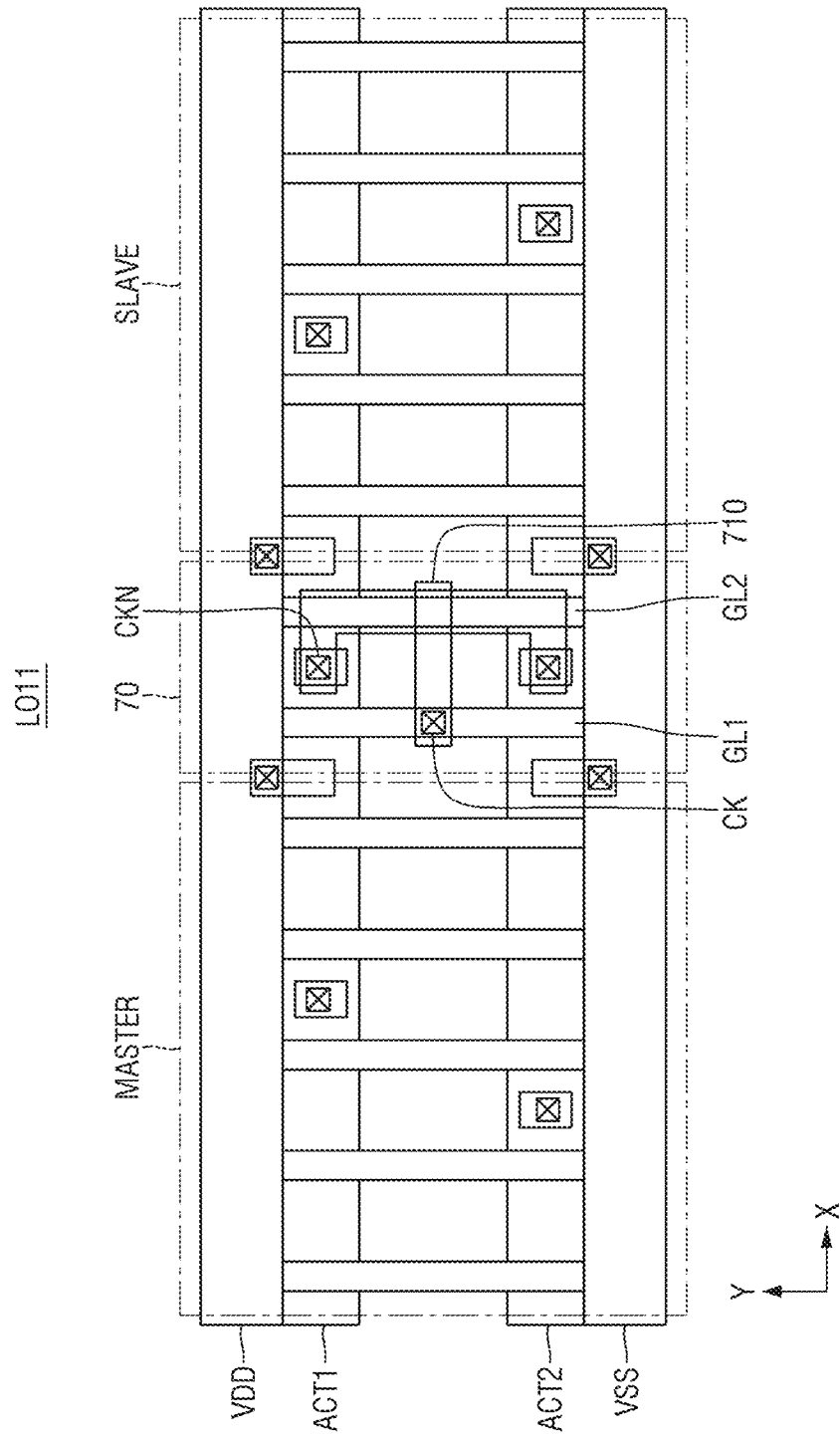

FIG. 16 is a layout L11 illustrating the output driver 70 of FIG. 15 in more detail. In the layout L11, the output driver 70 does not include SDB1 and SDB2 between the surrounding master latch main circuit 20a and slave latch circuits 40a and 50a. Instead, in order to increase the number of parallel connections, the output driver 70 is laid out to additionally use a gate line GL2.

Thus, the clock inverter 70 may be laid out to share single active regions ACT1 and ACT2 formed integrally, with the master latch main circuit 20a and the slave latch main circuit 40a.

As described above, the clock inverter 70 may be laid out so that the number of fins is the same as the number of fins of the master latch main circuit 20a and the number of fins of the slave latch main circuit 40a.

In concluding the detailed description, those skilled in the art will appreciate that many variations and modifications may be made to the disclosed example embodiments without substantially departing from the principles of the present disclosure. Therefore, the disclosed example embodiments of the disclosure are used in a generic and descriptive sense only and not for purposes of limitation.

What is claimed is:

1. A semiconductor circuit comprising:
   a plurality of master latch main circuits including a first master latch main circuit and a second master latch main circuit configured to latch signals of a first node and a fourth node based on a clock signal and an inverted clock signal, respectively, and to transmit the latched signals of the first node and the fourth node to a second node and a fifth node, respectively;
   a plurality of master latch auxiliary circuits including a first master latch auxiliary circuit and a second master latch auxiliary circuit configured to feed-back a signal of the second node and a signal of the fifth node to the first master latch main circuit and the second master latch main circuit, respectively;
   a plurality of slave latch main circuits including a first slave latch main circuit and a second slave latch main circuit configured to latch signals of the second node and the fifth node based on the clock signal and the inverted clock signal, respectively, and to transmit the latched signals of the second node and the fifth node to a third node and a sixth node, respectively;
   a plurality of slave latch auxiliary circuits including a first slave latch auxiliary circuit and a second slave latch auxiliary circuit configured to feed-back signals of the third node and the sixth node to the first slave latch main circuit and the second slave latch main circuit, respectively; and
   a clock inverter configured to invert the clock signal to generate the inverted clock signal, the clock inverter being between the second master latch main circuit and the second slave latch main circuit.

2. The semiconductor circuit of claim 1, wherein the second master latch main circuit is between the second master latch auxiliary circuit and the clock inverter.

3. The semiconductor circuit of claim 2, further comprising:
   a scan enable inverter configured to invert a scan enable signal to generate an inverted scan enable signal; and
   a first multiplexer configured to select first bit data or a first scan input signal based on the scan enable signal,
   a second multiplexer configured to select second bit data or a second scan input signal based on the scan enable signal, wherein
      the clock inverter is in a row different from the scan enable inverter.

4. The semiconductor circuit of claim 3, wherein the clock inverter is in a column different from the scan enable inverter.

5. The semiconductor circuit of claim 3, wherein, in a row of a layout associated with the semiconductor circuit, the first master latch main circuit is between the scan enable inverter and the first master latch auxiliary circuit.

6. The semiconductor circuit of claim 3, wherein the second master latch auxiliary circuit is in a same column as the scan enable inverter.

7. The semiconductor circuit of claim 3, wherein, in a row of a layout associated with the semiconductor circuit, the second multiplexer is between the second master latch auxiliary circuit and the second master latch main circuit.

8. The semiconductor circuit of claim 3, wherein, in a row of a layout associated with the semiconductor circuit, the first multiplexer is between the scan enable inverter and the first master latch main circuit.

9. The semiconductor circuit of claim 1, wherein the clock inverter comprises:
   a first clock inverter and a second clock inverter connected in series or in parallel with each other.

10. The semiconductor circuit of claim 9, wherein
    the plurality of master latch main circuits further include a third master latch main circuit configured to latch a signal of a seventh node based on the clock signal and the inverted clock signal, and to transmit the latched signal of the seventh node to an eighth node;
    the plurality of master latch auxiliary circuits further includes a third master latch auxiliary circuit configured to feed-back a signal of the eighth node to the third master latch main circuit;
    the plurality of slave latch main circuits further includes a third slave latch main circuit configured to latch the signal of the eighth node based on the clock signal and the inverted clock signal, and to transmit the latched signal of the eighth node to a ninth node; and
    the plurality of slave latch auxiliary circuits further includes a third slave latch auxiliary circuit configured to feed-back a signal of the ninth node to the third slave latch main circuit, wherein
       the first clock inverter is between the second master latch main circuit and the second slave latch main circuit, and
       the second clock inverter is between the third master latch main circuit and the third slave latch main circuit.

11. The semiconductor circuit of claim 10, wherein
    the second master latch main circuit is between the second master latch auxiliary circuit and the first clock inverter, and
    the third master latch main circuit is between the third master latch auxiliary circuit and the second clock inverter.

12. The semiconductor circuit of claim 1, wherein the clock inverter is configured to share a single active region formed integrally, with the second master latch main circuit and the second slave latch main circuit.

13. The semiconductor circuit of claim 12, wherein the clock inverter is laid out such that that a number of fins associated with the clock inverter is same as each of a number of fins associated with the second master latch main circuit and a number of fins associated with the second slave latch main circuit.

14. A semiconductor circuit comprising:
    a scan enable inverter configured to invert a scan enable signal to generate an inverted scan enable signal;
    a first multiplexer configured to select first bit data or a first scan input signal based on the scan enable signal, and to output a selected one of the first bit data or the first scan input signal to a first node;
    a second multiplexer configured to select a selected one of second bit data or a second scan input signal based on the scan enable signal, and to output the selected one of the second bit data or the second scan input signal to a fourth node;
    a plurality of master latch circuits including a first master latch circuit and a second master latch circuit configured to latch signals of the first node and the fourth node based on a clock signal and an inverted clock signal, respectively, and to transmit the latched signals of the first node and the fourth node to a second node and a fifth node, respectively, the first master latch circuit and the second master latch circuit each including a master latch auxiliary circuit configured to feed-back a signal of the second node and a signal of the fifth node, respectively;

a plurality of slave latch circuits including a first slave latch circuit and a second slave latch circuit configured to latch signals of the second node and the fifth node based on the clock signal and the inverted clock signal, respectively, and to transmit the latched signals of the second node and the fifth node to a third node and a sixth node, respectively; and a clock inverter configured to invert the clock signal to generate the inverted clock signal, the clock inverter being between the second multiplexer and the second master latch circuit in a physical layout of the semiconductor circuit.

15. The semiconductor circuit of claim 14, wherein the scan enable inverter is between the first multiplexer and the first master latch circuit.

16. The semiconductor circuit of claim 14, wherein the clock inverter is in a row different from the scan enable inverter.

17. The semiconductor circuit of claim 16, wherein the clock inverter is in a same column as the scan enable inverter.

18. The semiconductor circuit of claim 14, wherein the clock inverter comprises:
a first clock inverter and a second clock inverter connected in series or in parallel with each other.

19. The semiconductor circuit of claim 18, further comprising:
a third multiplexer configured to select a selected one of third bit data or a third scan input signal based on the scan enable signal, and to output the selected one of the third bit data or the third scan input signal to a seventh node, and wherein
the plurality of master latch circuits further include a third master latch circuit configured to latch a signal of the seventh node based on the clock signal and the inverted clock signal, and to transmits the latched signal of the seventh node to an eighth node,
the plurality of slave latch circuits further include a third slave latch circuit configured to latch a signal of the eighth node based on the clock signal and the inverted clock signal, and transmit the latched signal of the eighth node to a ninth node,
the first clock inverter is between the second multiplexer and the second master latch circuit, and the second clock inverter is between the third multiplexer and the third master latch circuit.

20. A semiconductor circuit layout system comprising:
a storage device configured to store a standard cell design; and
processing circuitry configured to lay out the standard cell design to generate a layout such that the layout includes,
a plurality of master latch main circuits including a first master latch main circuit and a second master latch main circuit configured to latch signals of a first node and a fourth node based on a clock signal and an inverted clock signal, respectively, and to transmit the latched signals of the first node and the fourth node to a second node and a fifth node, respectively;
a plurality of master latch auxiliary circuits including a first master latch auxiliary circuit and a second master latch auxiliary circuit configured to feed-back a signal of the second node and a signal of the fifth node to the first master latch main circuit and the second master latch main circuit, respectively;
a plurality of slave latch main circuits including a first slave latch main circuit and a second slave latch main circuit configured to latch signals of the second node and the fifth node based on the clock signal and the inverted clock signal, respectively, and to transmit the latched signals of the second node and the fifth node to a third node and a sixth node, respectively;
a plurality of slave latch auxiliary circuits including a first slave latch auxiliary circuit and a second slave latch auxiliary circuit configured to feed-back signals of the third node and the sixth node to the first slave latch main circuit and the second slave latch main circuit, respectively; and
a clock inverter configured to invert the clock signal to generate the inverted clock signal, wherein
the processing circuitry is configured to lay out the clock inverter such that the clock inverter is between the second master latch main circuit and the second slave latch main circuit.

* * * * *